US 6,749,685 B2

(12) United States Patent
Coleman (10) Patent No.: US 6,749,685 B2
(45) Date of Patent: Jun. 15, 2004

(54) SILICON CARBIDE SUBLIMATION SYSTEMS AND ASSOCIATED METHODS

(75) Inventor: Thomas G. Coleman, Pittsboro, NC (US)

(73) Assignee: Cree, Inc., Durham, NC (US)

(*) Notice: Subject to any disclaimer, the term of this patent is extended or adjusted under 35 U.S.C. 154(b) by 134 days.

(21) Appl. No.: 09/931,537

(22) Filed: Aug. 16, 2001

(65) Prior Publication Data

US 2003/0033976 A1 Feb. 20, 2003

(51) Int. Cl.[7] .............................................. C30B 23/00
(52) U.S. Cl. ........................ 117/84; 117/88; 117/98; 117/105; 117/107; 117/951
(58) Field of Search ............................. 117/84, 88, 98, 117/105, 107, 951; 204/173

(56) References Cited

U.S. PATENT DOCUMENTS

| | | | | |
|---|---|---|---|---|
| 4,422,172 A | * | 12/1983 | Dunn et al. ................. 373/94 |
| 4,505,948 A | * | 3/1985 | Pinkhasov ................. 427/580 |
| 4,582,004 A | * | 4/1986 | Fey et al. .................. 588/210 |
| 4,978,556 A | * | 12/1990 | Pinkahsov ................ 427/580 |
| 5,093,039 A | * | 3/1992 | Kijima et al. ............. 252/516 |
| 5,227,038 A | * | 7/1993 | Smalley et al. ............. 204/173 |
| RE34,861 E | * | 2/1995 | Davis et al. ................ 117/86 |
| 5,879,518 A | * | 3/1999 | Kuehnle ..................... 204/164 |
| 6,025,289 A | * | 2/2000 | Carter et al. ............... 501/86 |
| 6,090,733 A | * | 7/2000 | Otsuki et al. .............. 501/90 |
| 6,113,692 A | * | 9/2000 | Jaussaud et al. .......... 117/105 |

* cited by examiner

*Primary Examiner*—Nadine G. Norton
*Assistant Examiner*—Matthew Song
(74) *Attorney, Agent, or Firm*—Myers Bigel Sibley & Sajovec (57) ABSTRACT

Methods of growing silicon carbide are provided in which an electric arc is used to sublime a silicon carbide source material. In these embodiments, a silicon carbide seed crystal is introduced into a sublimation system, along with first and second electrodes that are separated by a gap. A power supply is coupled to at least one of the electrodes and used to create an electric arc across the gap between the two electrodes. This electric arc is used to sublime at least a portion of a silicon carbide source material. The vaporized silicon carbide material may then be encouraged to condense onto a seed material to produce monocrystalline or polycrystalline silicon carbide. In embodiments of the present invention, at least one of the electrodes is comprised of silicon carbide and serves as the silicon carbide source material.

36 Claims, 6 Drawing Sheets

SILICON CARBIDE SUBLIMATION SYSTEMS AND ASSOCIATED METHODS

FIELD OF THE INVENTION

The present invention relates to the growth of crystals and, more particularly, to the growth of silicon carbide crystals.

BACKGROUND OF THE INVENTION

Over the last decade, the use of silicon carbide as a semiconductor material has grown dramatically. Silicon carbide semiconductors have certain properties, including a wide bandgap, high thermal coefficient and capacity to operate at far higher temperatures than certain common semiconductor materials, such as silicon, which are desirable in various semiconductor applications.

In many applications, it is desirable to use an underlying semiconductor material that is substantially of a single polytype (silicon carbide can, at least theoretically, form at least 150 different types of crystal lattices or "polytypes"). Additionally, it is typically preferable that the semiconductor material have low levels of defects in the crystal lattice and/or low levels of unwanted impurities. In fact, even in a pure material, a defective lattice structure can prevent the material from being useful for electrical devices, and the impurities in any such crystal are preferably controlled to give certain desired electrical characteristics (such as an n or p character). As such, the availability of appropriate silicon carbide crystals is generally desired for the successful manufacture of electrical devices from silicon carbide. Additionally, because of cost considerations, it is desirable to grow relatively large silicon carbide crystals, from which a large number of "wafers" may be produced. Cost and device specific considerations also make it desirable that these wafers have a relatively large surface area.

Traditionally, two broad categories of techniques have been used for forming crystalline silicon carbide for semiconductor applications. The first of these techniques is known as chemical vapor deposition ("CVD") in which reactant gases are introduced into a system to form silicon carbide crystals upon an appropriate substrate. The second main technique is generally referred to as sublimation. In this technique, some type of solid silicon carbide material is generally used as a starting material. This starting material may be of one or more different polytypes, and may or may not include particles of the same polytype as the polytype which is desired for the single crystal semiconductor material. The solid silicon carbide starting material is heated in a crucible until it sublimes, and the vaporized material is encouraged to condense, with the condensation intended to produce the desired crystal. Typically, this is accomplished by introducing a monocrystalline silicon carbide seed into the crucible and heating it to a temperature less than the temperature at which silicon carbide sublimes. A pioneering patent that describes methods for forming crystalline silicon carbide for semiconductor applications using such sublimation techniques is U.S. Pat. No. 4,866,005 to Davis et al., issued Sep. 12, 1989, which was reissued as U.S. Pat. No. Re. 34,861, issued Feb. 14, 1995, which patents are incorporated herein by reference as if set forth in their entirety.

SUMMARY OF THE INVENTION

According to embodiments of the present invention, methods of growing silicon carbide are provided. Pursuant to embodiments of the present invention, these methods use an electric arc to sublime a silicon carbide source material. In these embodiments, a silicon carbide seed crystal is introduced into a sublimation system, along with first and second electrodes that are separated by a gap. A power supply is coupled to at least one of the electrodes and used to create an electric arc across the gap between the two electrodes. This electric arc is used to sublime at least a portion of a silicon carbide source material. The vaporized silicon carbide material may then be encouraged to condense onto a seed material to produce silicon carbide. In embodiments of the present invention, at least one of the electrodes is comprised of silicon carbide and serves as the silicon carbide source material.

In specific embodiments of the present invention, methods of growing silicon carbide are provided in which a silicon carbide source is electrically arced to sublime silicon and carbon containing material from the silicon carbide source and cause at least some of the silicon and carbon containing material to form silicon carbide on a silicon carbide seed. In certain of these embodiments, the electrical arc may be established between a pair of spaced apart silicon carbide electrodes. In forming silicon carbide pursuant to these methods, the power dissipated across a gap between the pair of spaced apart silicon carbide electrodes may be controlled to control the flow of vaporized Si, $Si_2C$ and $SiC_2$ from the pair of silicon carbide electrodes to the silicon carbide seed. In certain embodiments, this flow of vaporized Si, $Si_2C$ and $SiC_2$ per unit area per unit time from the pair of silicon carbide electrodes to the silicon carbide seed is controlled to be substantially constant.

In other embodiments of the present invention, the power dissipated across the gap is controlled by moving at least one of the pair of silicon carbide electrodes as they vaporize during the sublimation process to maintain a constant gap between the pair of silicon carbide electrodes. In specific embodiments, this control of the power dissipated across the gap may be accomplished by sensing the voltage drop across and/or the current through the gap and adjusting the relative location of the silicon carbide electrodes so as to maintain the voltage drop at a constant level. In yet other embodiments, the pressure within the sublimation system may be maintained at a substantially constant level during the sublimation process. These sublimation processes may occur within a heated furnace, and the internal temperature of the furnace, the position of the pair of silicon carbide electrodes, the voltage drop across the spacing between the pair of silicon carbide electrodes and the arc current may be configured so as to maintain the ends of the pair of silicon carbide electrodes adjacent the arc at a substantially constant temperature during the sublimation process.

In still further embodiments of the present invention, methods of growing silicon carbide are provided in which a furnace is heated to a temperature below the temperature at which silicon carbide sublimes, and a local high temperature zone is created within the furnace that is above the temperature at which silicon carbide sublimes. In these embodiments, a silicon carbide source material may be introduced into the high temperature zone to sublime silicon and carbon containing material from the silicon carbide source and cause at least some of the silicon and carbon containing material to form silicon carbide on a silicon carbide seed.

In other embodiments of the present invention, methods of growing silicon carbide are provided in which a seed of silicon carbide, a silicon carbide electrode and a second electrode are introduced into a sublimation system. The electrodes are positioned such that they are separated by a gap. In these embodiments, an electric arc may be established across the gap between the silicon carbide electrode and the second electrode to vaporize at least part of the silicon carbide electrode and cause at least some of the vaporized silicon carbide materials to form silicon carbide on the silicon carbide seed.

Sublimation systems which may be used in performing these methods are also disclosed herein.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In the present disclosure, a first element or component is sometimes referred to as being located or positioned "on" a second element or component. It will be appreciated that such references are intended to encompass both situations where the first element or component is located directly on the second element or component and where the first element or component is located on the second element or component through intervening structure(s).

Systems and methods according to embodiments of the present invention grow silicon carbide crystals using electric arc sublimation. Pursuant to embodiments of the systems and methods disclosed herein, the silicon carbide source material used in the sublimation process comprises at least one silicon carbide electrode, and this source material is sublimed by creating an electric arc between the silicon carbide electrode and a second electrode that raises the temperature of the silicon carbide electrode adjacent the arc to a temperature sufficient to sublime the silicon carbide. In other embodiments, a localized heat source is used instead of an electric arc to raise a portion of a silicon carbide source material to a temperature at which it sublimes.

In the electric arc embodiments of the present invention, by controlling the power dissipation across the electric arc, it may be possible to control the flow of vaporized Si, $Si_2C$ and/or $SiC_2$ from the silicon carbide source to a seed independent of both the internal temperature and/or pressure of the sublimation system. As a result, the temperature and pressure of the sublimation system may be set to grow a desired polytype of silicon carbide, as opposed to conventional silicon carbide sublimation techniques where the pressure and/or temperature may need to be adjusted throughout the process in an effort to maintain a relatively constant source-to-seed flux of the vaporized silicon carbide.

As will be appreciated by those of skill in the art, silicon carbide may be monocrystalline (i.e., silicon carbide that is substantially of a single polytype, although it may include defects in the crystal lattice, impurities, and small areas of other polytypes) or polycrystalline. The methods and systems of the present invention may be used grow both monocrystalline and polycrystalline silicon carbide. It will further be appreciated that monocrystalline silicon carbide is typically preferred in applications where the silicon carbide is used to form semiconductor devices. In such applications, monocrystalline silicon carbide is typically grown on a monocrystalline silicon carbide seed crystal.

Figure 1:
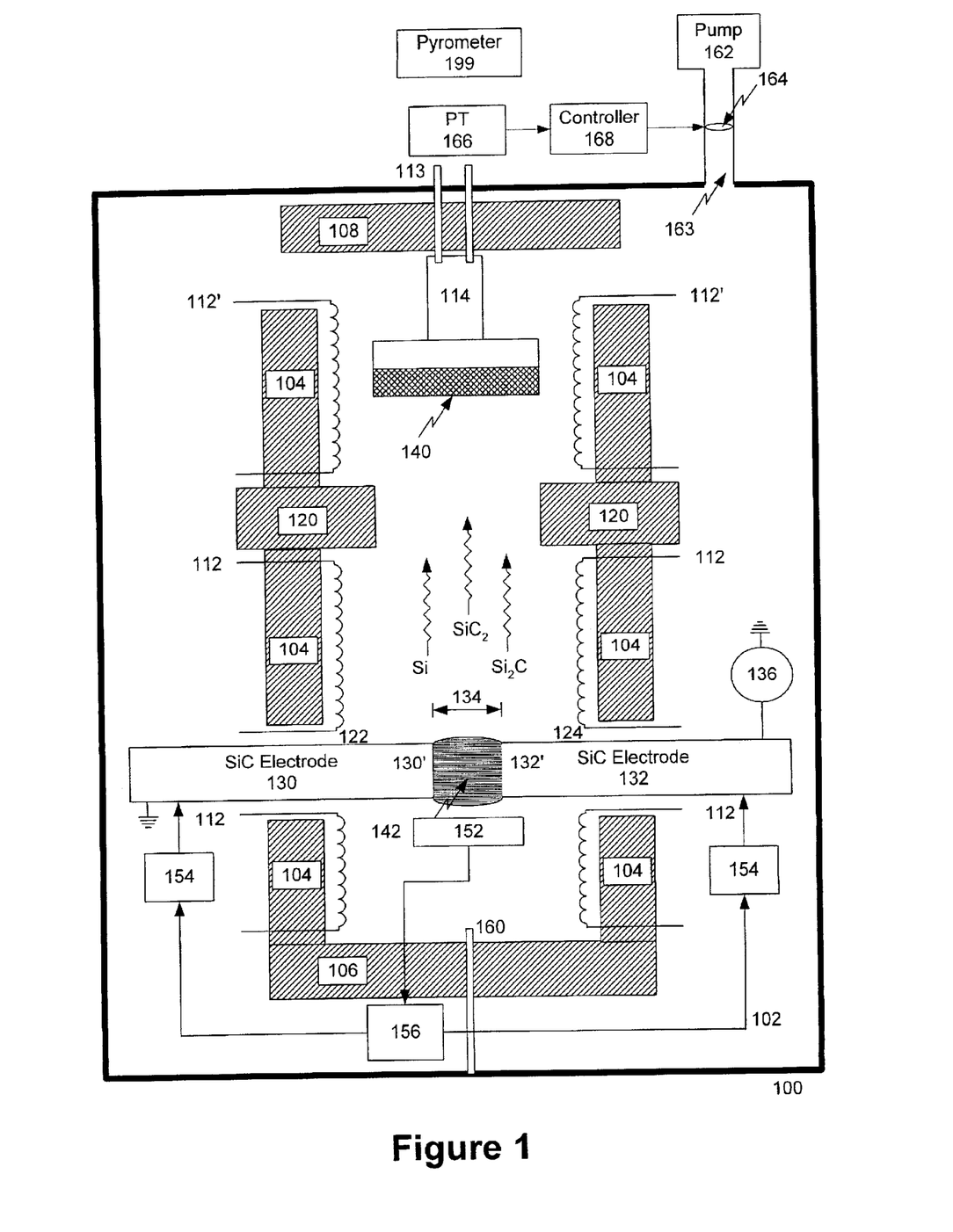
FIG. 1 is a schematic diagram of an electric arc silicon carbide sublimation system according to embodiments of the present invention.

FIG. 1 depicts a sublimation system 100 according to embodiments of the present invention. As shown in FIG. 1, the sublimation system 100 includes a high temperature furnace 102. Furnace 102 comprises side insulating walls 104, a bottom insulating wall 106, and a top insulating wall 108. The furnace 102 further includes a plurality of heating elements 112, 112' and a seed holder 114. The seed holder 114 may have in and out coolant feeds 113 which may be used to control the seed gradient and the growth rate of the silicon carbide. As indicated in FIG. 1, the heating elements 112, 112' may comprise resistive heating elements disposed along the side insulating walls 104 of the furnace 102. However, other heating such as radiant heating may be used. The furnace 102 may also include two recesses 122, 124 in the side insulating walls 104. A gas feed 160 in conjunction with a pressure control mechanism (reference numerals 162, 163, 164, 166, 168 in the embodiment of FIG. 1) may also be provided to facilitate establishing the pressure within the furnace at a desired level or levels. A pyrometer 199 may be used to measure the temperature at the seed 140 and/or at the seed holder 114. Other methods of measuring this temperature may also be used (e.g., thermocouples).

The sublimation system 100 further includes a pair of silicon carbide electrodes 130, 132. As shown in FIG. 1, the electrodes 130, 132 may be positioned in the respective recesses 122, 124. The electrodes 130, 132 are positioned such that they are separated by a gap 134. Silicon carbide electrode 132 is coupled to a grounded power supply 136, and silicon carbide electrode 130 is coupled to ground. However, it will be understood that other power supply arrangements could be provided, including providing multiple alternating current and/or direct current power supplies, or a combination thereof, that are attached to one or both electrodes 130, 132.

The silicon carbide electrodes 130, 132 may be configured in a variety of different shapes and sizes. By way of example, the electrodes may be rods having circular, square, rectangular or other cross-section, and the length of the electrodes 130, 132 may be established based on the amount of source material required. Alternatively, a rotating disk of silicon carbide might be used, which might facilitate providing a larger charge of silicon carbide source material in a furnace 102 of a given size, and may provide for finer control of the incremental movement of the electrodes discussed herein.

Sublimation system 100 may be operated as follows. The sublimation system 100 is evacuated of gases, and an inert gas such as argon, helium, xenon or the like may be input into the chamber. Those of skill in the art will appreciate that the sublimation system 100 may be operated with other gases or combinations of gases (e.g., adding a little hydrogen with an inert gas) in the chamber, or under vacuum conditions as well. The resistive heating elements 112, 112' are turned on to raise the inside temperature of furnace 102 to a temperature somewhat less than the temperature at which silicon carbide sublimes. As will be understood by those of skill in the art, the temperature at which sublimation occurs may depend on a variety of factors, including the pressure inside the furnace 102, and the polytype composition of the silicon carbide source material. Typically, the resistive heating elements 112' adjacent the seed holder 114 are set at a lower temperature (e.g., 20° C. lower) than the temperature of the remaining heating elements 112. Such a temperature differential may facilitate maintaining the furnace temperature adjacent the seed holder 114 at a temperature lower than the temperature of other locations within the furnace 102. This may help ensure that the silicon carbide vaporized during the sublimation process tends to condense on the seed 140 placed on seed holder 114. Typically, the heating elements 112, 112' are operated at a temperature higher that the temperature at which silicon carbide will sublime to a solid form. In this manner, the tendency for the silicon carbide vapor to condense in areas within the chamber other than the seed holder can be minimized or prevented.

It will also be appreciated that the sublimation pressure may be operated under constant or variable pressure conditions. Changes in pressure may be implemented by changing the flow rate at which gases are introduced into the chamber or by changing the rate at which gases are evacuated from the chamber. As will be appreciated by those of skill in the art, it may be advantageous to decrease the pressure during growth in order to attempt to maintain a constant flux between the source silicon carbide material and the seed 140 as the source material is slowly being depleted.

Prior to activating resistive heating elements 112, 112', a silicon carbide seed crystal 140 is placed on the seed holder 114. The furnace 102 may also be pressurized to a preselected pressure. The furnace 102 is heated to an appropriate temperature and power supply 136 may be activated, causing a current to flow through silicon carbide electrode 132. The gap 134 between the electrodes 130, 132 and the setting on the power supply 136 are configured so that the current flowing through electrode 132 creates, and flows across, an electric arc 142 between silicon carbide electrode 132 and silicon carbide electrode 130, and then flows through silicon carbide electrode 130 to electrical ground (in the exemplary embodiment of FIG. 1).

The electric arc 142 acts to increase the temperature of the ends 130', 132' of the electrodes 130, 132. This increase in temperature may be sufficient to raise the ends 130', 132' of electrodes 130, 132 to a temperature above the temperature at which silicon carbide sublimes (given the pressure level within the furnace 102). As indicated by the upwardly pointing arrows in FIG. 1, as the silicon carbide electrodes sublimes, it can form up to three or more basic vaporized materials: Si, $Si_2C$ and $SiC_2$. Depending upon the polytype of the source powder used to form the silicon carbide electrodes 130, 132 (see discussion herein), the amount or "flux" of each of the species that is generated may differ. As used herein, the term "flux" refers to the amount of matter or energy passing through a designated plane of a given area during a given period of time. Accordingly, when used to describe the flow of vaporized species, flux can be measured and designated in units of matter, area and time such as grams per square centimeter per second ($g/cm^2/sec$).

As shown in FIG. 1, the vaporized Si, $Si_2C$ and/or $SiC_2$ flow from the electrodes 130, 132 toward the seed 140. As the seed 140 is maintained at a temperature below which silicon carbide sublimes, the vaporized Si, $Si_2C$ and/or $SiC_2$ tend to condense onto the seed, resulting in macroscopic growth of silicon carbide that may be substantially of a desired polytype. Typically, the seed holder 114 will rotate the seed 140 during the sublimation process to encourage uniform growth across the surface area of the seed 140.

As is also shown in FIG. 1, the sublimation system 100 may further include a flux control system, which in the embodiment of FIG. 1 comprises the items labeled 152, 154, 156. This flux control system 152, 154, 156 may be provided to facilitate maintaining a substantially uniform flow of Si, $Si_2C$ and/or $SiC_2$ of consistent composition from the silicon carbide electrodes 130, 132 to the seed 140, and will be described in detail below. As will be understood by those of skill in the art, such a uniform, consistent composition, flow of the vaporized species of silicon carbide can facilitate the growth of monocrystalline silicon carbide on the seed 140. Such monocrystalline structures are generally preferred for semiconductor applications.

As the ends 130', 132' of silicon carbide electrodes 130, 132 sublime, the gap 134 between the two electrodes 130, 132 increases. This increase in the size of the gap 134 may result in a decrease in the current flowing across the gap from electrode 132 to electrode 130, as the voltage required to maintain a specific current level may increase with the size of the gap 134. As the current flow across the gap 134 decreases, the temperature of the ends 130', 132' of electrodes 130, 132 likewise may decrease, which may result in a reduction of the flow of Si, $Si_2C$ and/or $SiC_2$ from the silicon carbide electrodes 130, 132 to the seed 140. Flux control system 152, 154, 156 may operate to reduce and preferably prevent such a reduction in flow of Si, $Si_2C$ and/or $SiC_2$ from occurring.

In the embodiment of sublimation system 100 depicted in FIG. 1, the flux control system comprises a voltage detector 152, a pair of motorized electrode positioners 154 and a processor 156. Voltage detector 152 measures the voltage across the gap 134. Voltage detector 152 could be implemented as an integral part of the power supply for the electrodes or as an independent unit used to control the output voltage of the power supply. The output of voltage detector 152 is fed to processor 156, which determines the incremental change in the position of one or both of the electrodes 130, 132 which is required to maintain the voltage across the gap 134 at its original level. Processor 156 may determine this incremental change value in a variety of ways, including, for example, by use of a look up table or by positive feedback from the voltage detector 152 in response to small changes in the position of the electrodes 130, 132. The motorized electrode positioners 154 are responsive to the processor 156 and implement the actual change in the relative positions of the electrodes 130, 132. Typically an electrode positioner 154 will be associated with each electrode 130, 132 so that the gap 134 may be maintained directly below the seed 140 throughout the sublimation process. The flux control system 152, 154, 156 in the embodiment of FIG. 1 thus may be used to maintain a substantially constant flow of Si, $Si_2C$ and/or $SiC_2$ by maintaining the length of gap 134 at a constant value so that constant power dissipation occurs across the gap 134.

Electronic monitoring and control systems comprising a voltage detector, motorized positioners and a processor are commercially available, such as, for example, the units which are used to create intense light sources for developing offset printing negatives in the lithography industry. It will also be appreciated that a current meter that detects the current across the arc 142 and/or a thermometer that measures the temperature at or directly adjacent to the ends of the silicon carbide electrodes 130, 132 as they are positioned at the beginning of the sublimation process could be used instead of, or in addition to, the voltage detector 152, as could a variety of other detection devices. Likewise, a mechanical, optical or other type of measuring system could be used to measure or estimate the length of gap 142.

In an alternative embodiment of the present invention, the flux control system may not include the voltage detector 152 or the processor 156. In this embodiment, the rate of erosion of the silicon carbide electrodes 130, 132 during sublimation is determined in advance, and the motorized electrode positioners 154 are set to incrementally move the electrodes 130, 132 at a rate that compensates for the erosion. In this embodiment of the invention, it may be desirable, in some instances, to carefully select electrodes 130, 132 based on density, source polytype and/or any other parameter that may effect the rate of erosion under given furnace temperature and pressure and arc voltage and current conditions.

In yet another embodiment of the present invention, the current across the gap 134 may be maintained during the sublimation process by increasing the setting on the power supply 136 as opposed to by moving the electrodes 130, 132 to maintain a constant gap size as the ends 130', 132' of the electrodes 130, 132 sublime. In this embodiment, the actual size of the gap 134 would increase throughout the sublimation process, but the current would be maintained by sensing the voltage and/or current drop that starts to occur as the ends 130', 132' of the electrodes 130, 132 sublime, and increasing the power supplied to electrode 132 to compensate for such decreases. However, it may be preferable to maintain the constant current across the gap 142 by physically moving the electrodes 130, 132 as is done in the embodiment of FIG. 1 as opposed to by increasing the setting on power supply 136, as the increase in gap size may change the flow patterns of the vaporized Si, $Si_2C$ and/or $SiC_2$ and/or the surface area of the electrodes 130, 132 which reach sublimation temperatures, both of which may result in non-uniform flow of Si, $Si_2C$ and/or $SiC_2$ or flow with inconsistent composition from the electrodes 130, 132 to the seed 140 during the sublimation process.

It will also be appreciated that various combinations of the above-described embodiments of the present invention may be employed, or that multiple of the measurement/detection techniques and/or mechanisms for keeping a substantially constant current flow across the gap 142 may be employed in a single system. Those of skill in the art will also appreciate in light of the present disclosure that additional measurement/detection techniques and/or mechanisms for keeping a substantially constant current flow across the gap 142 other than the exemplary embodiments disclosed herein may be employed that will still provide the benefits of the present invention.

In embodiments of the present invention, the gap 134 between the first and second electrodes 130, 132 is between 0.2 mm and 5.0 mm. However, it will be appreciated that gaps of other dimensions may be provided as the gap size selected depends, among other things, on the electrode voltage and system pressure. Gaps larger than 5.0 mm may be used, but larger gaps may require higher voltage settings on the power supply to maintain the desired current flow across the gap. Additionally, as the gap increases beyond a certain range, it may be difficult to maintain the current flow at a constant level due to the limits of the output potential of the power supply.

Likewise, a wide range of different arc current levels may work well in the sublimation systems of the present invention. The current level used may depend on a variety of factors, including, for example, the internal temperature and pressure of the furnace 102, the desired rate of vaporization, and the composition of the electrodes 130, 132.

As will be appreciated by those of skill in the art in light of the present disclosure, the sublimation systems and methods of the present invention can provide a way to control the flow of Si, $Si_2C$ and/or $SiC_2$ from the electrodes 130, 132 to the seed 140 that can be independent of the pressure within the furnace 102, and which can be at least partly independent of the temperature settings within the furnace 102. As such, the pressure during sublimation and, to some extent, the temperature, may be set to select a desired polytype of silicon carbide that is to be grown and/or to reduce the number of defects in the grown crystal. In contrast, current silicon carbide sublimation systems may reduce the pressure within the crucible throughout the sublimation process in an effort to maintain the source-to-seed flow of Si, $Si_2C$ and/or $SiC_2$ at a relatively constant level. Such a reduction in pressure may be used because as the source silicon carbide powder charge depletes, the volume/surface area which is subliming at any given point also typically decreases. Consequently, to maintain substantially constant flux for extended periods of time it may be desired to increase the temperature within the sublimation system and/or decrease the pressure. Such modifications to the temperature or pressure within the sublimation system, however, can adversely effect the monocrystalline nature of the silicon carbide grown on the seed 140 in applications where it is desired to grow monocrystalline silicon carbide.

Additionally, under certain temperature/pressure conditions, it is known that certain types of defects tend to grow in various polytypes of silicon carbide. Accordingly, if the temperature and/or pressure are adjusted during sublimation using conventional sublimation techniques in an effort to maintain a constant flow of Si, $Si_2C$ and/or $SiC_2$ during the sublimation process, temperature and/or pressure conditions may be in place for portions of the process that tend to encourage the growth of defects. Furthermore, when conventional sublimation techniques are used, the composition of the flux tends to change over time (i.e., it does not have a consistent composition) as certain elements or compounds are depleted from the charge in the crucible. Such inconsistencies in the composition of the flux may also adversely effect the quality of the crystal grown. However, pursuant to the teachings of the present invention the degree of such inconsistencies can be reduced, as the limited amount of source material that is raised to a sublimation temperature at any given time may provide for consistent depletion of specific elements/compounds in the source material.

In this regard, the volume and surface area of the silicon carbide electrodes which sublime at any given time during the sublimation process may be controlled by providing electrodes 130, 132 which are substantially the same shape, composition and density throughout their length. By using such electrodes 130, 132, and by maintaining the furnace 102 temperature and pressure constant, as well as the current transferred across the arc 142, generally the same volume and surface area of electrodes 130, 132 will be raised to a sublimation temperature at any given time during the sublimation process. However, it will be understood that in the shape, composition and/or density of the silicon carbide electrodes 130, 132 could be variable as well, and in certain applications it may even be advantageous to provide such variability to offset other effects during the sublimation process.

A preferred or optimum pressure level for the sublimation process may depend on a number of factors, including, for example, the polytype of silicon carbide that is to be grown, the characteristics of the seed 140 used, the internal temperature of the furnace 102, and the power dissipated across the gap 134. Depending upon these factors, pressures from just a fraction of atmospheric pressure to five, ten or even more times higher than atmospheric pressure may be preferred.

As noted above, the flow of Si, $Si_2C$ and/or $SiC_2$ from the electrodes 130, 132 to the seed 140 may only be partly independent of the temperature within the furnace 102. The flow control may not be completely independent of the temperature inside the furnace 102 because the temperature caused by the current flow through the arc 142 can raise the temperature of the respective ends 130', 132' of silicon carbide electrodes 130, 132 to a temperature at which they start to sublime. Additionally, the temperature of the furnace walls 104, 106, 108 should also be sufficiently high such that the vaporized Si, $Si_2C$ and/or $SiC_2$ tends to condense of the seed 140 instead of on the walls 104, 106, 108.

It will be appreciated that a wide variety of furnaces may be employed in the sublimation systems of the present invention. Typically, the furnace should be capable of heating to temperatures in excess of 2000° C. and, more preferably, to at least 2500° C., to allow for silicon carbide sublimation at a wide variety of pressure levels. In an exemplary situation, the interior of the furnace might be heated to a temperature on the order of 2300° C., while the seed crystal 140 might be heated to a temperature on the order of 2280° C. However, it will be understood that sublimation and condensation are equilibrium processes that may be affected by the vapor pressure of the system as well as the absolute and relative temperatures. Accordingly, it will be understood that in the processes and systems described herein, the appropriate temperatures generally will be a function of the selected vapor pressure level (and vice versa).

Furnaces suitable for use in the sublimation systems of the present invention are commercially available, such as the Crystal furnace, manufactured by Centorr/Vacuum Industries. Such furnaces may be modified to facilitate mounting the silicon carbide electrodes 130, 132 and to provide for mounting of the flux control system components within and/or outside the furnace 102.

Moreover, the furnace 102 may use heating techniques other than resistive heating, such as induction heating. Likewise, a variety of configurations may be employed for locating the silicon carbide electrodes 130, 132 with respect to the seed 140, and for locating the various heating elements 112, 112' used. Additionally, channeling walls 120, or some other means for channeling the flow of vaporized Si, $Si_2C$ and/or $SiC_2$ in a preferred direction may be provided. Typically, the walls 104, 106, 108 of the furnace 102 are formed of insulating material such as, for example, graphite.

The furnace 102 may include recesses such as recesses 122, 124 in FIG. 1 into which the silicon carbide electrodes 130, 132 may be inserted. Such recesses may allow for the use of large electrodes (e.g., 4 feet in length) which may extend outside the main chamber of the furnace 102. In this manner, significantly larger amounts of silicon carbide source material may be provided for the sublimation process, as the charge holder in conventional sublimation crucibles is typically limited in volume. Accordingly, it will be appreciated that the methods and systems of the present invention can facilitate growing larger diameter crystals and larger boules.

Additionally, as noted above, it will also be appreciated that in conventional silicon carbide sublimation systems, the location of the source material within the crucible may impact the uniformity and/or the consistency of the flow of Si, $Si_2C$ and/or $SiC_2$ from the source to the seed, as temperature variations may exist adjacent different portions of the charge which, as the charge is depleted, may cause variation in the flux. Such variations may be compounded as larger crucible designs (having increased charge capacity) are employed, particularly to the extent a thermal gradient exists between the source material and the interior of the furnace 102 just above the seed 140. In contrast, pursuant to embodiments of the methods and systems of the present invention, only the area adjacent the gap 134 may need to be raised to a temperature at which silicon carbide sublimes. Consequently, it is possible to maintain a relatively constant volume/surface area of silicon carbide that is raised to a sublimation temperature throughout the entirety of the sublimation process by maintaining the ends 130', 132' of the silicon carbide electrodes 130, 132 in the same position throughout the sublimation process via incremental movement. It will be understood, however, that other locations in the furnace may be raised in temperature as well. Additionally, a crucible need not be used as the sublimation process may instead take place directly within the confines of the furnace 102.

As noted above, the pressure and temperature within the furnace 102 may be pre-selected to encourage the growth of a specific polytype of silicon carbide and/or to otherwise optimize growth conditions. In the embodiment of FIG. 1, a gas feed 160 is used to establish the pressure within the furnace 102, along with vacuum pump 162, valve 164, pressure transducer 166 and controller 168. Specifically, gas feed 160 is used to feed a pressurized gas such as argon into the interior of furnace 102. Various other gases (which need not be inert) may also be used. Pressure transducer 166 senses the pressure within the furnace 102 and relays this information to the controller 168. The controller 168 controls valve 164 which is placed across an outlet 163 provided in the top of the furnace 102. Once the desired pressure has been reached inside the furnace 102, controller 168 incrementally opens valve 164. The vacuum pump 162 is situated on the opposite side of the valve 164, and is configured to draw gas out of the interior of furnace 102. Via feedback provided by pressure transducer 166, controller 168 opens the valve 164 a sufficient amount to equalize the pressure within furnace 102 given a constant feed of gas into the furnace via gas feed 160. However, other pressurization systems and/or gases (or a vacuum) may be used.

As noted above, power supply 136 may be either a direct current ("DC") or alternating current ("AC") power supply. Pursuant to the teachings of the present invention, it will be understood that forming the arc 142 using a DC power supply may be desirable in certain embodiments, such as ones in which dissimilar electrode materials (e.g., silicon carbide and tungsten, graphite or molybdenum) are used. However, under certain circumstances (e.g., pressure and temperature conditions, electrode composition, current values, etc.), during the sublimation process the use of a DC power supply may encourage the electrodes 130, 132 to vaporize unevenly. Thus, in certain situations, use of an AC power supply may be preferred as the alternating nature of the power supplied serves to balance out any imbalance in the erosion characteristics of the electrodes 130, 132. However, when an AC power supply is operated at certain frequencies, it may result in the silicon carbide source material vaporizing off of one electrode and then condensing on to the other electrode. Consequently, the frequency setting on the power supply will typically be set to a frequency that helps provide for balanced erosion, and that avoids transfer of silicon carbide from one electrode to the other. It will also be understood that a combination of AC and DC power supplies may be used (e.g., connecting one electrode to an AC power supply and the other electrode to a DC power supply), and that the electrodes 130, 132 need not be grounded.

In sublimation systems in which a DC power supply is used, it may be advantageous to provide a second DC power source that is coupled to electrode 130 and set to an equal but opposite setting of the power supply 136. This may help to reduce unequal erosion of the electrodes. Additionally, in situations where the silicon carbide electrodes 130, 132 are very pure (and hence have relatively poor intrinsic conductivity), it may be advantageous to use an AC power supply set at a high frequency as the high frequency, enhances the conductivity of the electrodes.

Figure 4:
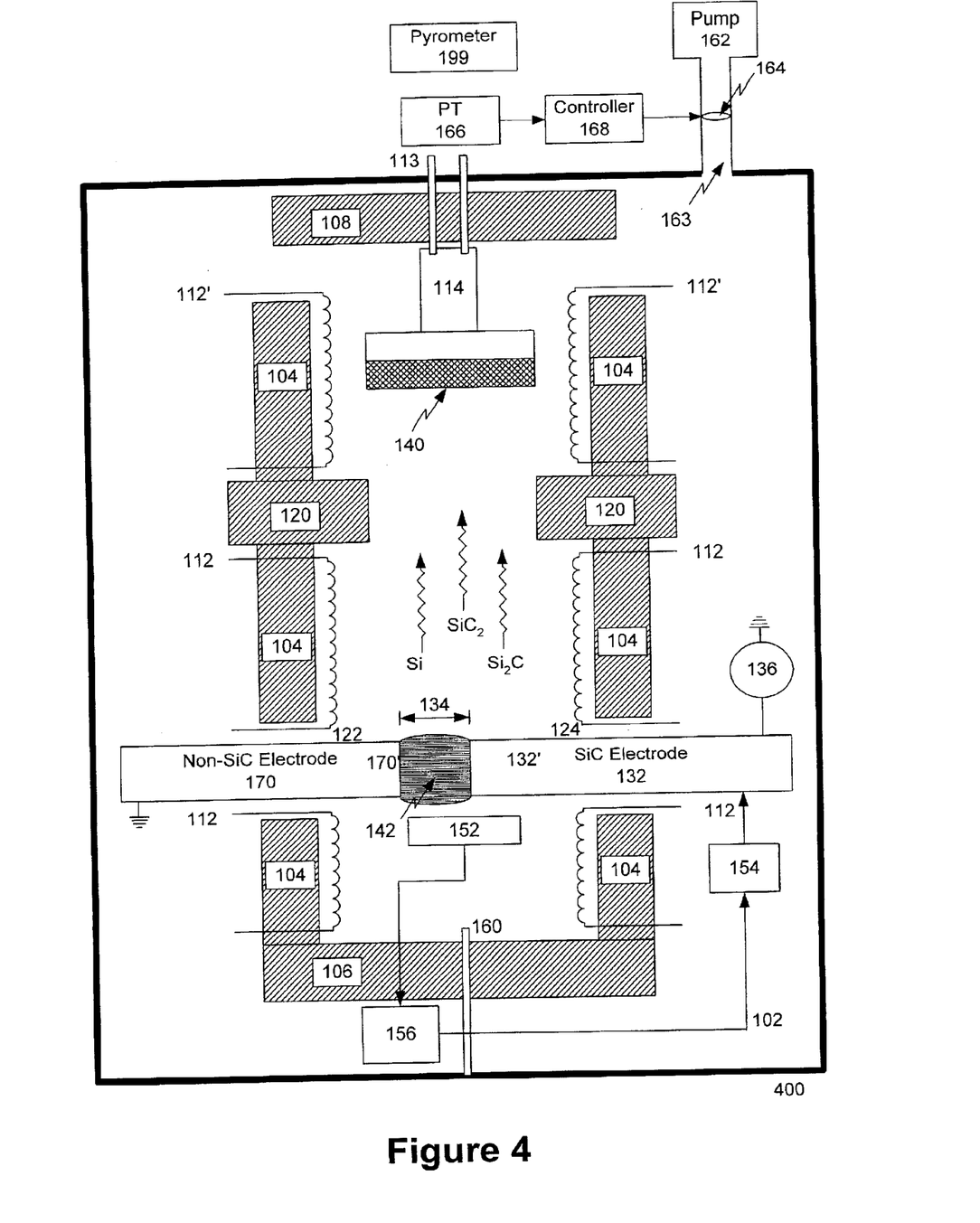
FIG. 4 is a schematic diagram of an electric arc silicon carbide sublimation system according to alternative embodiments of the present invention.

As noted above, in alternative embodiments of the present invention, the electric arc may be established between a silicon carbide electrode and another electrode that is not formed of silicon carbide. In these embodiments, the non-silicon carbide electrode could be formed of a variety of materials, including, for example, graphite, tungsten, molybdenum or tantalum carbide. Preferably, the non-silicon carbide conductor is formed of a material or materials that vaporize at higher temperatures than silicon carbide. FIG. 4 illustrates an exemplary embodiment of a sublimation system 400 according to the present invention in which an electric arc is established between a silicon carbide electrode 132 and a non-silicon carbide electrode 170. In the particular embodiment of the invention depicted in FIG. 4 many of the components are identical to the corresponding components depicted in FIG. 1 (i.e., the components having like numbers in FIG. 1 and FIG. 4), and hence these like components will not be re-described here.

In the particular embodiment of FIG. 4, the flux control system 152, 154, 156 is only configured to move one of the electrodes, namely silicon carbide electrode 132. Such an arrangement may be preferred in embodiments in which non-silicon carbide electrode 170 does not vaporize during the sublimation process. However, it will be appreciated that the system can be configured such that both electrodes 132, 170 are repositioned during the sublimation process, or so that both electrodes remain stationary (as the flux may be controlled by means other than movement of the electrodes as discussed above with respect to the embodiment of FIG. 1). As illustrated in FIG. 4, the distal end 132' of silicon carbide electrode 132 may be positioned so that it is directly below the silicon carbide seed 140. However, it will also be appreciated that different positionings of the electrodes 132, 170 are also possible.

Figure 5:
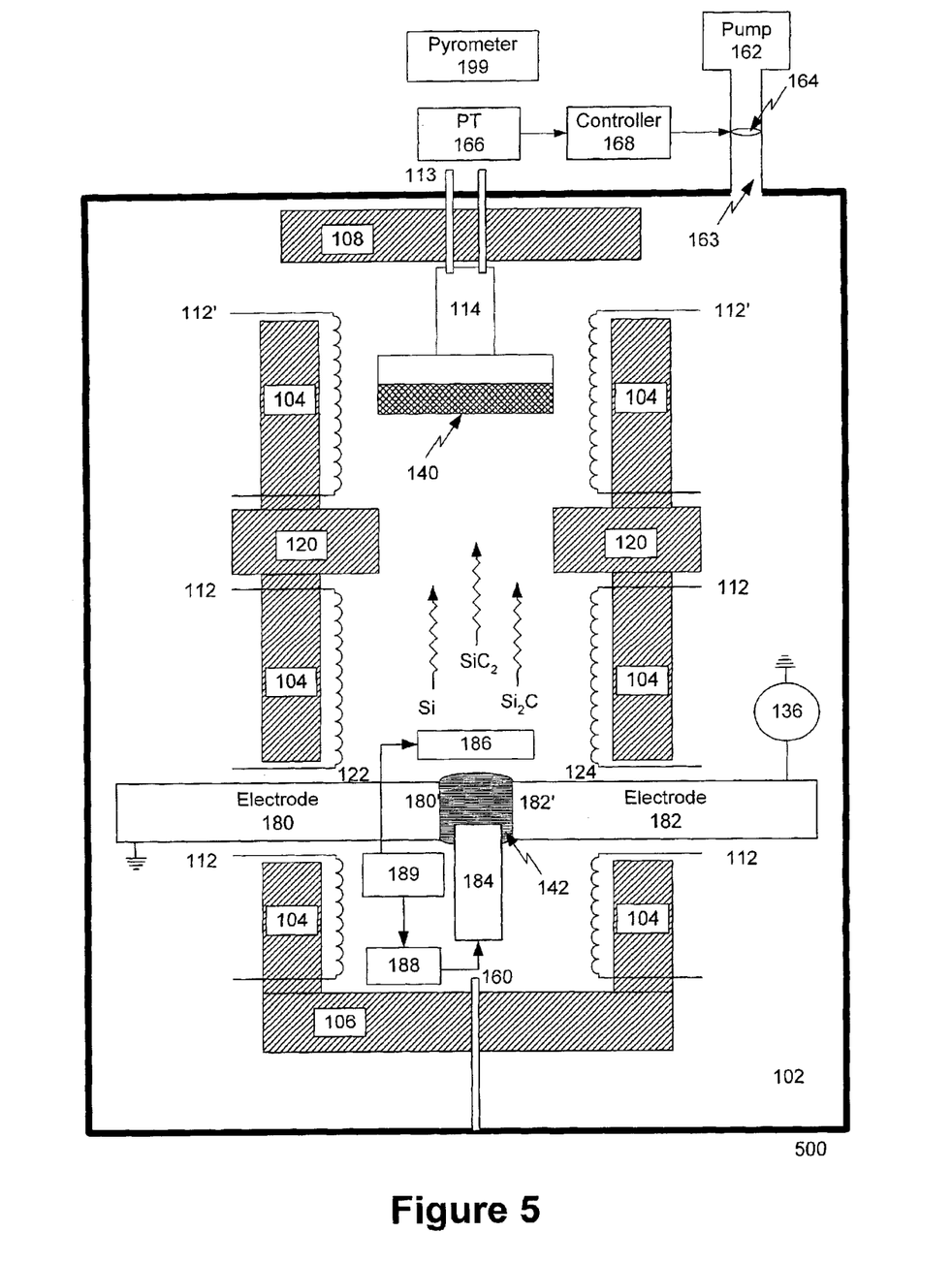
FIG. 5 is a schematic diagram of an electric arc silicon carbide sublimation system according to alternative embodiments of the present invention.

As is also discussed above, in still other embodiments of the present invention the electric arc may be established between two or more non-silicon carbide electrodes and a silicon carbide source material may be positioned adjacent the electric arc. In these embodiments, the non-silicon carbide electrode could be formed, for example, out of any of the materials listed above with respect to the embodiments of the present invention which incorporate a single silicon carbide electrode. FIG. 5 illustrates an exemplary embodiment of a sublimation system 500 according to the present invention in which an electric arc 142 is established between a pair of non-silicon carbide electrodes 180, 182 and a silicon carbide source material 184 is located adjacent the arc 142 formed between electrodes 180, 182. It may be more difficult in such an embodiment to generate sufficient energy adjacent the arc 142 to cause the silicon carbide source material 184 to sublime. In the particular embodiment of the invention depicted in FIG. 5 many of the components are identical to the corresponding components depicted in FIG. 1 (i.e., the components having like numbers in FIG. 1 and FIG. 5), and hence these like components are not re-described here.

In the particular embodiment of FIG. 5, the flux control system comprises a sensor 186, a silicon carbide source material positioner 188 and a processor 189. The sensor 186 may be used to measure a variety of parameters that are indicative as to the rate at which the silicon carbide source material 184 is subliming including, for example, the voltage across the arc 142, the current through the arc 142, the temperature adjacent the arc 142, etc. This information is fed to a processor 189 which controls a material positioner 188 that moves the silicon carbide source material 184 closer to the arc 142 as the silicon carbide source material 184 sublimes. It will be appreciated that in a manner similar to the embodiment of FIG. 1, either the position of the arc 142 or the position of the silicon carbide source material 184 may be varied as the silicon carbide source material 184 sublimes. Likewise, both the silicon carbide source material 184 and the arc 142 may remain stationary and the current through the arc 142 may instead be varied (see above discussion with respect to the embodiment of FIG. 1).

In the embodiment of FIG. 5, the furnace 102 may be heated to a temperature below the temperature at which silicon carbide sublimes. An electric arc 142 may be established between the electrodes 180, 182, which may have the effect of increasing the temperature in a localized area adjacent the arc 142 within the furnace 102. The silicon carbide source material 184 may be positioned adjacent the arc 142, so that a portion of the silicon carbide source material is within the localized area of increased temperature and is raised to a temperature at which silicon carbide sublimes. As this portion of the silicon carbide source material 184 sublimes, the sensor 186 senses the rate of sublimation and via processor 189 and positioner 188 acts to move either the silicon carbide source material 184 or the arc 142 (e.g., by moving conductors 180, 182) to maintain a relatively constant rate of vaporization of the silicon carbide source material. As with the embodiment of FIG. 1, such a flux control system may also be omitted, by, for example pre-programming the silicon carbide source material 184 and/or the electrodes 180, 182 to move relative to each other such that the distance between the silicon carbide source material 184 and the arc 142 is maintained at a desired distance throughout the sublimation process.

Figure 6:
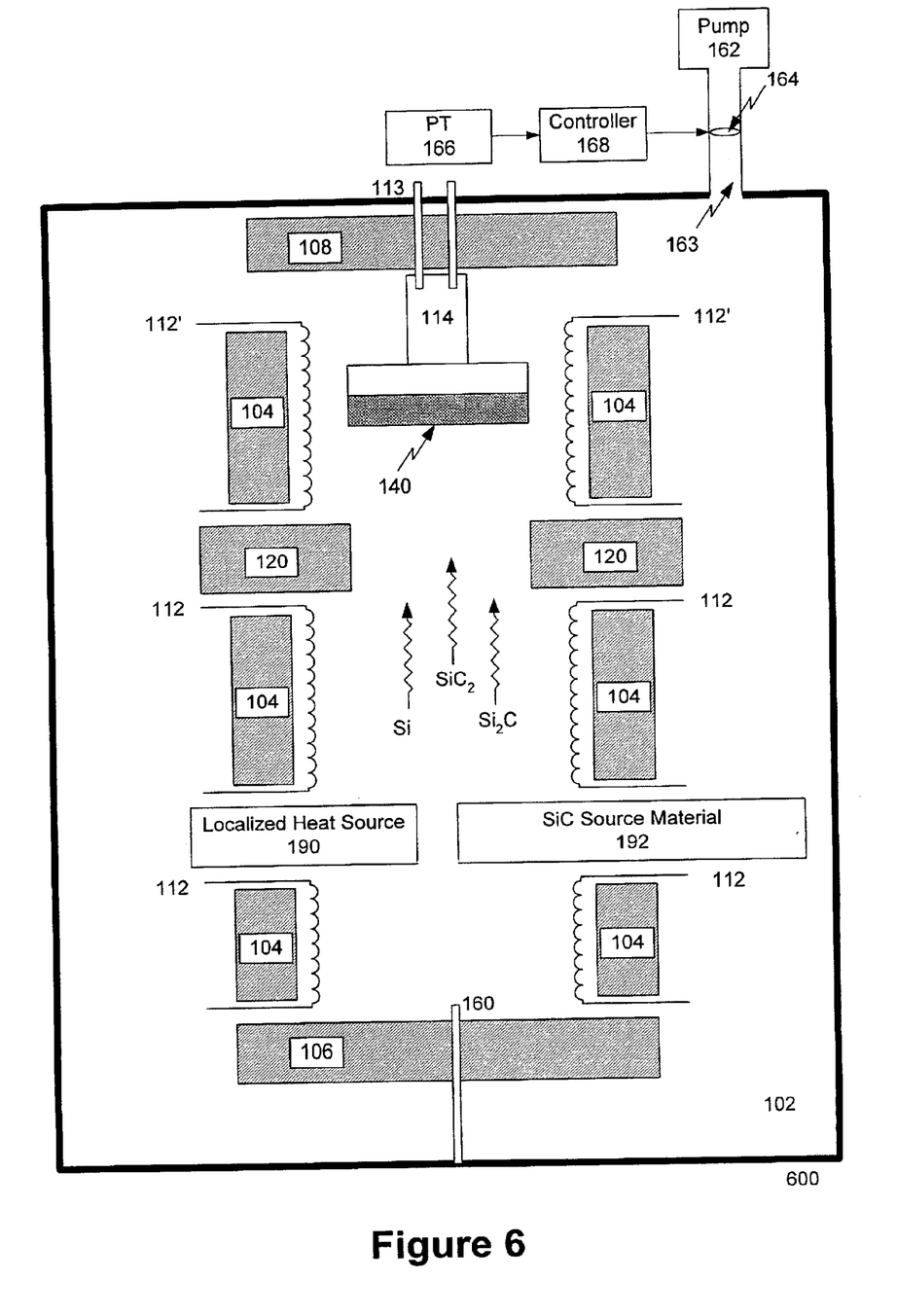
FIG. 6 is a schematic diagram of a silicon carbide sublimation system according to alternative embodiments of the present invention.

In yet other embodiments of the present invention, a localized region within a furnace 102 may be raised to a temperature above the temperature at which silicon carbide sublimes by providing a localized heat source 190 within the furnace 102. Such a localized heat source 190 could be implemented using, for example, an induction heating configuration localized to the end of the electrodes. FIG. 6 depicts an exemplary silicon carbide sublimation system 600 according to these embodiments of the present invention.

As illustrated in FIG. 6, one end or region of a silicon carbide source material 192 is placed adjacent a localized heat source 190. During the sublimation process, the localized heat source 190 may be used to raise this end or region of silicon carbide source material 192 to a temperature at which it sublimes. A flux control system (not pictured in FIG. 6) may be used to control the temperature in the furnace adjacent the end of silicon carbide source material 192 to control the rate at which it sublimes. Such a flux control system may comprise, for example, positioning mechanisms that maintain the end of silicon carbide source material 192 at a constant distance from localized heat source 190 and/or a feedback mechanism that is used to increase the output temperature of localized heat source 190 as the distance between the localized heat source 190 and the silicon carbide source material 192 increases. As with the embodiments of the present invention depicted in FIG. 4 and FIG. 5, the particular embodiment of FIG. 6 includes many components that are identical to the corresponding components depicted in FIG. 1 (i.e., the components having like numbers) and hence these like components will not be re-described here.

It will be appreciated to those of skill in the art in light of the present disclosure that various combinations of the sublimation systems disclosed with respect to FIG. 1 and FIGS. 4–6 may be made. Thus, for instance, various of the alternative embodiments of the sublimation system of FIG. 1 that are described above may likewise be incorporated in the sublimation systems of FIG. 4, FIG. 5 and/or FIG. 6.

Additionally, while various embodiments of the present invention include mechanisms which facilitate maintaining a constant source-to-seed flow of Si, $Si_2C$ and $SiC_2$, it will be appreciated that by such a constant flow is not necessary, and may not even be desired depending upon various other of the sublimation conditions, such as the temperature and/or pressure within the furnace.

In embodiments of the present invention, one or more silicon carbide electrodes are provided. It will be appreciated that these electrodes may be comprised solely of silicon carbide or, alternatively, may include other materials. For instance, in certain embodiments it may be preferred to coat a silicon carbide electrode with another material and/or provide a core of another material in the center of the electrode. Use of such another material might be employed to, for example, increase the conductivity of the electrode. The additional material provided in such silicon carbide electrodes may be of a material that sublimes at temperatures higher than the sublimation temperature for silicon carbide. In any event, it will be understood that the term "silicon carbide electrode" as used in the present application is intended to encompass silicon carbide electrodes which include materials other than silicon carbide.

In embodiments of the present invention, the silicon carbide electrodes are formed from a source silicon carbide powder. The source material may be grown, for example, by a chemical vapor deposition method of decomposing methyl trichlorosilane. Typically, both the mixture of polytypes in the source powder and the particle size distribution of the source powder will be selected to optimize the size and purity of the crystal that is to be grown. The source powder may be formed into an electrode by "sintering", which refers to a process whereby the source powder is placed into a mold and then subjected to a thermal treatment sufficient to partially, but not completely, melt the source powder particles. This causes the source powder to congeal into a solid, and the particle sizes of the source powder and the thermal treatment conditions may be selected to achieve a desired density electrode (as the density of the electrode may impact the silicon carbide crystal grown during the sublimation process).

In additional embodiments of the present invention, the silicon carbide source powder may be n- and/or p-doped depending upon the type of semiconductors which are to be formed on the silicon carbide crystal grown during the sublimation process. Silicon carbide powder that is n-doped may be obtained, for example, by growing the powder in a nitrogen-rich environment, whereas p-doped silicon carbide source powder may be obtained by growing the powder in, for example, an aluminum-rich environment.

Figure 2:
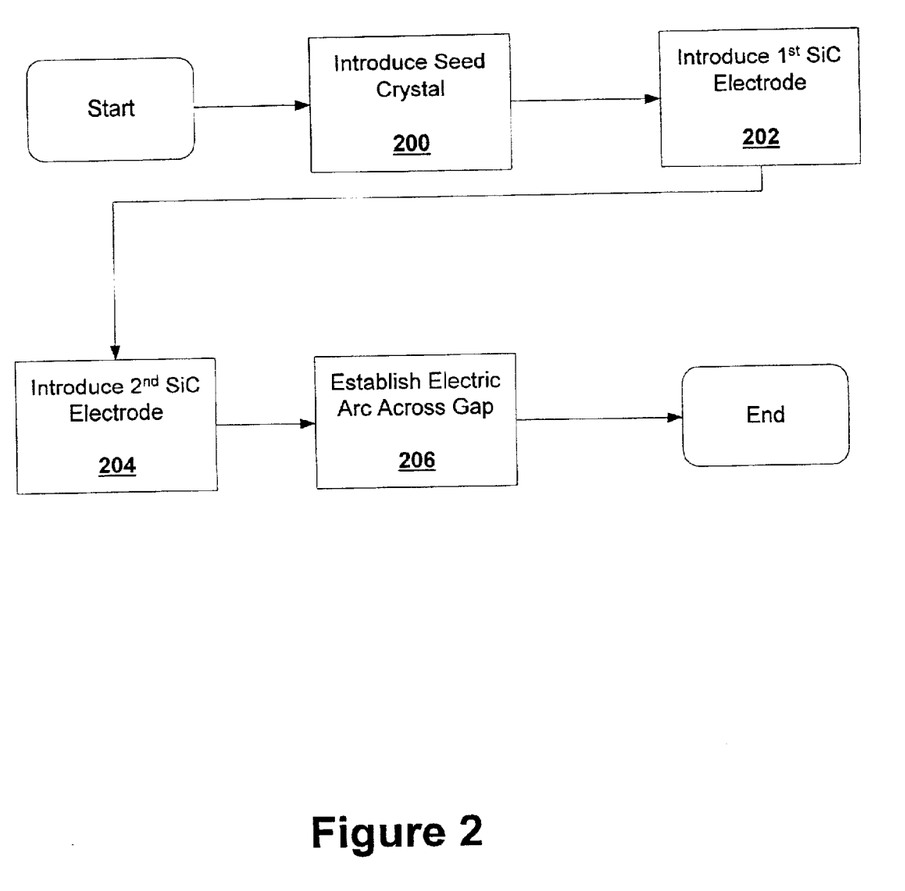
FIG. 2 is a flow chart depicting methods of growing crystals of a single polytype of silicon carbide according to embodiments of the present invention.

FIG. 2 is a flow chart illustrating methods of growing crystals of silicon carbide according to embodiments of the present invention. Pursuant to these methods, a seed crystal of silicon carbide is introduced into the sublimation system (block 200). As noted above, in applications where the silicon carbide is to be used for semiconductor fabrication, the seed crystal is typically monocrystalline. Either before or after introduction of this seed, first and second silicon carbide electrodes are also introduced into the sublimation system (blocks 202, 204). These electrodes are positioned within the system such that they are separated by a gap. Once the electrodes are in place, an electric arc is established across the gap between the first and second silicon carbide electrodes (block 206). This electric arc increases the temperature of at least a portion of each electrode to a temperature at which at least part of the electrode starts to sublime, thereby providing vaporized silicon carbide for crystal growth upon the seed crystal.

Figure 3:
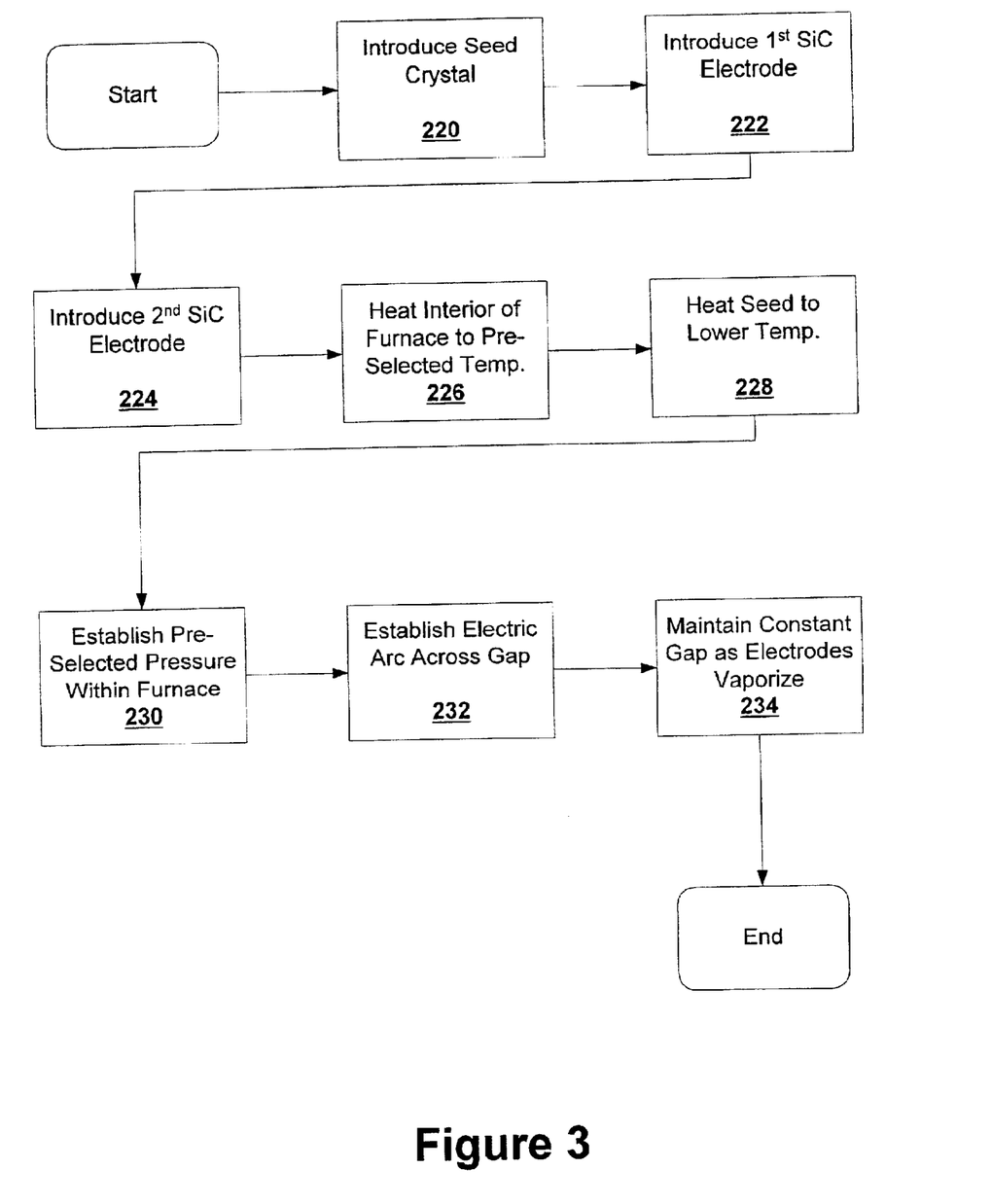
FIG. 3 is a flow chart depicting methods of growing crystals of a single polytype of silicon carbide according to additional embodiments of the present invention.

FIG. 3 is another flow chart illustrating further methods of growing silicon carbide according to embodiments of the present invention. Pursuant to these methods, a seed crystal of silicon carbide is introduced into the sublimation system (block 220). Either before or after introduction of this seed, first and second silicon carbide electrodes are also introduced into the sublimation system (blocks 222, 224). These electrodes are positioned within the system such that they are separated by a gap. The interior of the sublimation system is then heated to a pre-selected temperature (block 226). The seed is also heated to a high temperature, but this temperature is less than the temperature to which the walls of the furnace are heated (block 228). At some point after the seed and electrodes are introduced into the furnace, the pressure within the furnace is set to a pre-selected level (block 230). Typically, both the furnace temperature, the seed temperature and the pressure within the furnace are set to levels that are selected to grow a selected polytype of silicon carbide having as few defects as possible and/or to optimize the rate of growth or the size of the crystal grown. Once the temperature and pressure are set, an electric arc is established across the gap between the first and second silicon carbide electrodes (block 232). As discussed above, this may be accomplished by coupling an AC and/or a DC power supply to one or both of the electrodes. This electric arc increases the temperature of at least a portion of each electrode to a temperature at which the electrode starts to sublime, thereby providing material for crystal growth upon the seed crystal. As the portion of the first and second electrodes adjacent the arc start to erode away, the relative position of the electrodes is changed to maintain a gap of constant length (block 234).

It will be appreciated by those of skill in the art that the acts depicted in FIG. 2 and FIG. 3 need not be carried out in the specific order indicated in the figure. For instance, the pre-selected pressure may be established (block 230) prior to the heating described at blocks 226 and 228. Likewise, the seed and first and second electrodes may be introduced in any order (blocks 220, 222, 224), and the furnace could be heated before some or all of these elements are introduced.

Accordingly, the order of the blocks in FIG. 2 and FIG. 3 are not intended to limit the scope of the present invention.

While the figures and descriptions herein disclose specific embodiments of the present invention, these embodiments are provided to ensure that the present disclosure is full and complete, and is not intended to limit the scope of the claims appended hereto. Thus, for example, the order in which steps of the sublimation processes disclosed herein are carried out may be modified without departing from the scope of the present invention, as those of skill in the art will realize that the timing of when specific materials are introduced into the sublimation system, or the order in which various portions of the furnace are heated or pressurized may be modified without significant impact on the disclosed processes.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of growing silicon carbide, the method comprising:
   introducing a seed of silicon carbide into a sublimation system;
   introducing a silicon carbide electrode into the sublimation system;
   introducing a second electrode into the sublimation system adjacent the silicon carbide electrode, wherein the silicon carbide electrode and the second electrode are separated by a gap;
   establishing an electric arc across the gap between the silicon carbide electrode and the second electrode to sublimate at least part of the silicon carbide electrode and cause at least some of the sublimated silicon carbide materials to form silicon carbide on the silicon carbide seed; and
   controlling the power dissipated across the gap to control a flow of vaporized Si, $Si_2C$ and $SiC_2$ from the silicon carbide electrode to the seed of silicon carbide.

2. The method of claim 1, wherein the second electrode is a silicon carbide electrode.

3. The method of claim 2, wherein controlling the power dissipated across the gap further controls a flow of vaporized Si, $Si_2C$ and $SiC_2$ from the second electrode to the seed of silicon carbide.

4. The method of claim 3, wherein controlling the power dissipated across the gap comprises moving at least one of the silicon carbide electrode and the second electrode as they vaporize during the sublimation process to maintain a constant gap between the silicon carbide electrode and the second electrode.

5. The method of claim 2, further comprising maintaining the pressure within the sublimation system at a substantially constant level during the sublimation process.

6. The method of claim 2, wherein the silicon carbide electrode is formed by sintering silicon carbide powder.

7. The method of claim 6, wherein the silicon carbide electrode is formed from an n-type carrier rich silicon carbide source powder.

8. The method of claim 6, wherein the silicon carbide electrode is formed from a p-type carrier rich silicon carbide source powder.

9. The method of claim 2, wherein the internal temperature of the sublimation system, the pressure within the sublimation system and the voltage and current associated with the electric arc are maintained so as to heat a constant volume of the silicon carbide electrode above the temperature where sublimation occurs during a crystal growth phase of the sublimation process.

10. The method of claim 2, wherein the silicon carbide electrode is formed from silicon carbide powder grown by a chemical vapor deposition technique.

11. The method of claim 1, wherein the power dissipated across the gap is controlled to maintain a substantially constant flow of vaporized Si, $Si_2C$ and $SiC_2$ per unit area per unit time from the silicon carbide electrode to the seed crystal.

12. The method of claim 1, wherein controlling the power dissipated across the gap comprises moving at least one of the silicon carbide electrode and the second electrode during the sublimation process to maintain a constant gap between the silicon carbide electrode and the second electrode.

13. The method of claim 1, further comprising moving at least one of the silicon carbide electrode and the second electrode to maintain a substantially constant separation between the silicon carbide electrode and the second electrode.

14. The method of claim 1, further comprising maintaining the pressure within the sublimation system at a substantially constant level during the sublimation process.

15. The method of claim 14, where the substantially constant pressure level is set to ensure that a specific polytype of silicon carbide is grown.

16. The method of claim 14, further comprising:
   raising the temperature of the seed to a temperature lower than the temperature at which silicon carbide sublimes; and
   raising the temperature of the silicon carbide electrode to a temperature lower than the temperature at which silicon carbide sublimes.

17. The method of claim 16, wherein the sublimation system includes a furnace, and wherein the method further comprises raising the temperature of the inner walls of the furnace to a temperature higher than the temperature of the seed.

18. The method of claim 1, wherein the internal temperature of the sublimation system, the position of the silicon carbide electrode and the second electrode, a voltage drop across the gap and a current conducted across the gap are configured so as to maintain the end of the silicon carbide electrode adjacent the gap at a substantially constant temperature during the sublimation process.

19. The method of claim 18, where the substantially constant temperature is set to ensure that a specific polytype of silicon carbide is grown.

20. The method of claim 1, wherein controlling the power dissipated across the gap to control the a flow of vaporized Si, $Si_2C$ and $SiC_2$ from the silicon carbide electrode to the seed crystal comprises:
   sensing a voltage drop across the gap; and
   adjusting the relative location of the silicon carbide electrode and the second electrode so as to maintain the voltage drop at a constant level.

21. The method of claim 20, further comprising rotating the seed during at least part of the sublimation process.

22. The method of claim 1, wherein establishing an electric arc between the silicon carbide electrode and the second electrode comprises activating an alternating current power supply that is electrically connected to one of the silicon carbide electrode and the second electrode.

23. The method of claim 22, wherein the frequency at which the alternating current power supply is operated is selected to maintain substantially the same rate of vaporization of the silicon carbide electrode.

24. The method of claim 1, wherein the silicon carbide seed is a monocrystalline seed of silicon carbide, and wherein the silicon carbide formed on the monocrystalline silicon carbide seed is monocrystalline silicon carbide.

25. A method of growing silicon carbide, the method comprising:

establishing an electrical arc between a pair of electrodes spaced apart by a gap in order to electrically arc a silicon carbide source to sublimate silicon and carbon containing material from the silicon carbide source and cause at least some of the silicon and carbon containing material to form silicon carbide on a silicon carbide seed; and controlling the power dissipated across the gap to control the flow of vaporized Si, $Si_2C$ and $SiC_2$ from the silicon carbide source to the silicon carbide seed.

26. The method of claim 25, wherein the electrodes are silicon carbide electrodes that serve as the silicon carbide source.

27. The method of claim 26, wherein the power dissipated across the gap is controlled to maintain a substantially constant flow of vaporized Si, $Si_2C$ and $SiC_2$ per unit area per unit time from the pair of silicon carbide electrodes to the silicon carbide seed.

28. The method of claim 26, wherein controlling the power dissipated across the gap comprises moving at least one of the pair of silicon carbide electrodes as they vaporize during the sublimation process to maintain a constant gap between the pair of silicon carbide electrodes.

29. The method of claim 26, wherein controlling the power dissipated across the gap to control the flow of vaporized Si, $Si_2C$ and $SiC_2$ from the pair of silicon carbide electrodes to the silicon carbide seed comprises:

sensing a voltage drop across the gap; and adjusting the relative location of the silicon carbide electrodes so as to maintain the voltage drop at a constant level.

30. The method of claim 25, further comprising maintaining the pressure within the sublimation system at a substantially constant level during the sublimation process.

31. The method of claim 25, wherein the sublimation process occurs within a heated furnace, and wherein internal temperature of the furnace, the position of the pair of silicon carbide electrodes, the voltage drop across the spacing between the pair of electrodes and the arc current are configured so as to maintain the ends of the pair of electrodes adjacent the arc at a substantially constant temperature during the sublimation process.

32. The method of claim 25, wherein the sublimation process occurs within a heated furnace, and wherein an internal temperature of the furnace, a pressure within the furnace and the voltage and current associated with the arc are maintained so as heat a constant volume of the silicon carbide source above the temperature where sublimation occurs during a crystal growth phase of the sublimation process.

33. The method of claim 25, wherein the silicon carbide formed on the silicon carbide seed is monocrystalline silicon carbide.

34. A method of growing silicon carbide, the method comprising:

using resistive or inductive heating to heat a furnace to a temperature below the temperature at which silicon carbide sublimes;

using an electric arc to create a local high temperature zone within a the furnace that is above the temperature at which silicon carbide sublimes while mantaining the inner walls of the furnace at a temperature below the temperature at which silicon carbide sublimes;

introducing a silicon carbide source material into the high temperature zone to sublimate silicon and carbon containing material from the silicon carbide source and cause at least some of the silicon and carbon containing material to form silicon carbide on a silicon carbide seed.

35. The method of claim 34, wherein the silicon carbide source material is introduced into the high temperature zone by moving the silicon carbide source material.

36. The method of claim 34, wherein the silicon carbide source material is introduced into the high temperature zone by moving a heating source used to create the local high temperature zone.

* * * * *

UNITED STATES PATENT AND TRADEMARK OFFICE
CERTIFICATE OF CORRECTION

PATENT NO. : 6,749,685 B2
DATED : June 15, 2004
INVENTOR(S) : Coleman

It is certified that error appears in the above-identified patent and that said Letters Patent is hereby corrected as shown below:

Column 16,
Line 52, should read -- dissipated across the gap to control a flow of vaporized --

Column 18,
Line 26, should read -- zone within the furnace that is above the temperature --

Signed and Sealed this

Thirtieth Day of November, 2004

JON W. DUDAS
*Director of the United States Patent and Trademark Office*